United States Patent [19]
Saller et al.

[11] Patent Number: 4,780,689
[45] Date of Patent: Oct. 25, 1988

[54] AMPLIFIER INPUT CIRCUIT

[75] Inventors: Kenneth R. Saller; John S. Farnbach, both of Fort Collins, Colo.

[73] Assignee: Comlinear Corporation, Fort Collins, Colo.

[21] Appl. No.: 75,609

[22] Filed: Jul. 20, 1987

[51] Int. Cl.[4] ............................................. H03F 3/30
[52] U.S. Cl. ..................................... 330/267; 330/255
[58] Field of Search ............... 330/255, 257, 267, 288, 330/311

[56] References Cited
U.S. PATENT DOCUMENTS

| 4,502,020 | 2/1985 | Nelson et al. | 330/265 |
| 4,628,279 | 12/1986 | Nelson | 330/257 |
| 4,630,685 | 1/1987 | Saller et al. | 330/263 |

FOREIGN PATENT DOCUMENTS 95713  6/1984  Japan .................................. 330/257

OTHER PUBLICATIONS

Blauschild, "An 8b 50ns Monolithic A/D Converter with internal S/H," *1983 IEEE International Solid-State-Circuits Conference*, Feb. 24, 1983, pp. 178-179.

"A New Approach to Op Amp Design" Application Note 300-1, Comlinear Corporatioln, Mar. 1985.

*Primary Examiner*—James B. Mullins
*Attorney, Agent, or Firm*—Dean P. Edmundson

[57] ABSTRACT

An improved amplifier input circuit for use as the input stage for a current feedback amplifier to reduce offset and limit overload currents. The circuit includes first and second bias current supplies, first and second diodes having anode and cathode terminals, a PNP transistor and a NPN transistor, first and second input terminals, and first and second current sense terminals. Currents flowing through the sense terminals are sensitive to an input current in the first input terminal. Bias currents from the first and second bias current supplies are divided, respectively, between the PNP transistor and first diode, and the NPN transistor and second diode. The base terminals of the transistors are connected in common to the second input terminal. Other embodiments are also described.

18 Claims, 8 Drawing Sheets

AMPLIFIER INPUT CIRCUIT

FIELD OF THE INVENTION

This invention relates to amplifier input circuits. More particularly, this invention relates to an improved input circuit for a current feedback amplifier.

BACKGROUND OF THE INVENTION

Current feedback amplifiers have been shown to have a number of advantages over voltage input amplifiers, particularly in the areas of dynamic performance, such as in settling time, small-signal bandwidth, and slew rate. A number of circuit topologies for current feedback are known in the art. See, for example, U.S. Pat. Nos. 4,502,020 (Nelson, 4,628,279 (Nelson and Saller), and 4,639,685 (Saller and Rentel). The principle of current feedback is also discussed in Application Note 300-1 of Comlinear Corporation entitled "A New Approach to Op Amp Design."

BRIEF DESCRIPTION OF DRAWINGS

The invention and the prior art are described in more detail hereinafter with reference to the accompanying drawings wherein like reference characters refer to the same parts throughout the several views and in which.

DESCRIPTION OF THE PRIOR ART

Figure 1:
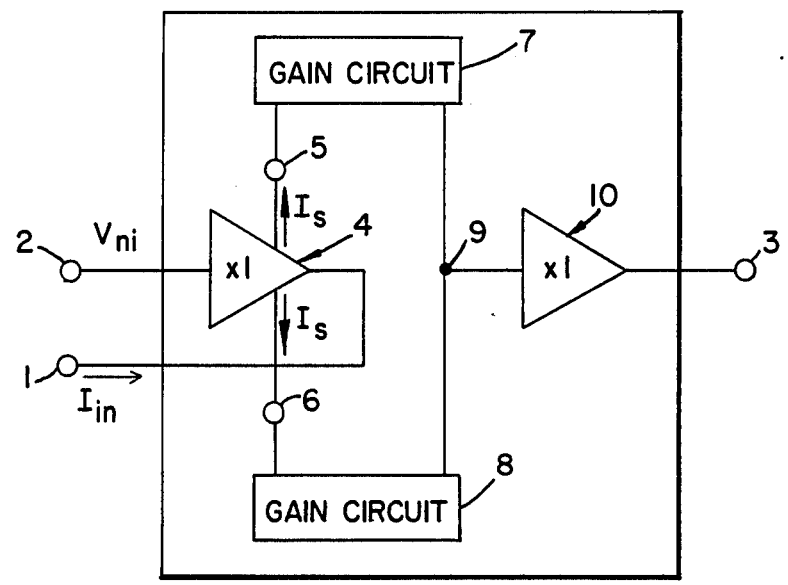
FIGS. 1–5 are schematic diagrams of prior art circuits.

Many of the advantageous properties of the current-feedback amplifier depend upon the characteristics of the input stage. FIG. 1 is a typical block diagram of a conventional current feedback amplifier as known in the prior art, showing inverting input terminal 1, non-inverting input terminal 2, and output terminal 3. For proper functioning of current feedback, the impedance to a current flowing through inverting input terminal 1 must be low (ideally zero), and the output voltage at trminal 3 must be sensitive to the current, Iin, flowing through inverting input terminal 1. In addition it is often useful that the open-circuit voltage at inverting input terminal 1 be equal to the voltage applied to non-inverting input terminal 2 and that the impedance to a current flowing through non-inverting input terminal 2 be high (ideally infinite).

To accomplish this, the input stage of the current feedback amplifier in FIG. 1 includes unity gain buffer 4, with current sense terminals 5 and 6. Input buffer 4 drives the voltage at inverting input terminal 1 to be equal to the voltage at non-inverting input terminal 2, while current sense terminals 5 and 6 carry a common sense current signal, Is, which is responsive to the current flowing through inverting input terminal 1. Current sense terminals 5 and 6 are connected to the inputs of gain circuits 7 and 8, respectively. The outputs of gain circuits 7 and 8 are connected in common to gain node 9. A buffer amplifier 10 then drives the volateg at terminal 3 responsively to the voltage at gain node 9.

For proper operation of the current feedback amplifier, gain circuits 7 and 8 must provide bias voltages at current sense terminals 5 and 6 for proper operation of input buffer 4. Further, gain circuits 7 and 8 must provide a voltage signal gain node 9, which voltage signal must be responsive to the sense current signals, Is, flowing through the inputs of gain circuits 7 and 8. The sensitivity of the voltage signal at gain node 9 must be such that an increase in current flowing into inverting input terminal 1 causes a decrease in voltage at gain node 9.

Many specific circuits for gain circuits 7 and 8 and for buffer 10 are known in the art. See, for example, the U.S. Patents cited above, and *Analysis and Design of Analog Integrated Circuits*, Second Edition, by Paul R. Gray and Robert G. Meyer, John Wiley & Sons, New York, 1984, incorporated herein by reference.

Specific circuits for input buffers of current feedback amplifiers which are known in the art and taught in the previously cited patents have a characteristic limitation which is very disadvantageous in many situations. When the amplifier is overdriven by accidentally or unavoidably applying excessive input signals, large currents may flow in the input buffer and through the sense terminals. These large currents may cause damage to the input buffer or to the gain circuits. Other input stage circuits which are known in the art provide current limiting, but these are unsuitable for use in current feedback amplifiers since they do not provide the low impedance necessary for the inverting input terminal.

Figure 2:
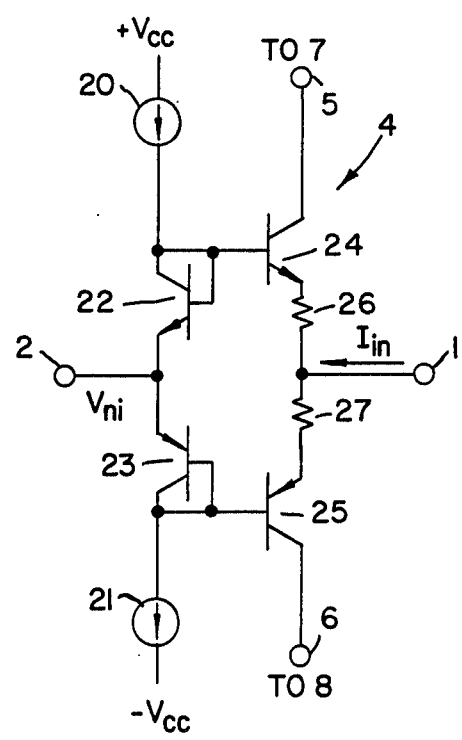

FIG. 2 shows one form of current feedback input buffer as known in the art. Inverting input terminal 1, non-inverting input terminal 2, and current sense terminals 5 and 6 are shown. Operation of this circuit is best understood by first considering quiescent operating conditions, when inverting input terminal 1 is open-circuited such that Iin=0, and non-inverting input terminal 2 is driven to signal ground such that Vni=0. Under these conditions, the voltage present at inverting input terminal 1 is the offset voltage of the input stage, which it is desirable to minimize.

Quiescent operation of the circuit of FIG. 2 depends upon matching among groups of transistors. Transistors are matched if they exhibit similar characteristics of emitter current versus base-emitter voltage. Also a diode and a transistor may be matched if the diode current-voltage characteristics are similar to the transistor emitter-base current-voltage characteristics. Matching is achieved by employing similar geometries, processing, construction and manufacturing for the matched devices.

In FIG. 2, bias current sources 20 and 21 cause equal currents to flow through diode-connected transistors 22 and 23 to provide base voltage bias to transistors 24 and 25. If transistor 22 is matched to transistor 24, and transistor 23 is matched to transistor 25 as described above, the quiescent current through transistors 24 and 25 will be approximately equal to that provided by bias sources 20 and 21. Emitter resistors 26 and 27 are often required in order to prevent thermal run-away and to stabilize quiescent currents.

If the transistors are matched as described above, the base-emitter voltage drops of transistors 22 and 24 will be nearly equal since their emitter currents are equal, as will those of transistors 23 and 25, so that the open circuit voltage at inverting input terminal 1 will be nearly equal to the voltage, Vni, applied to non-inverting input terminal 2 for low offset voltage as required of a current feedback input stage.

When a signal current, Iin, is caused to flow through inverting input terminal 1, the signal current splits into roughly equal portions, Iin/2, flowing into the emitters of each of transistors 24 and 25. Except for small base current errors, the emitter currents flow through the collectors of transistors 24 and 25 to become the common sense currents, Is=Iin/2 flowing through sense terminals 5 and 6. For a given direction of inverting input signal current, the sense currents will add to the quiescent emitter current through one of transistors 24 and 25, and subtract through the other.

Although the circuit of FIG. 2 serves well as a current feedback input stage in some applications, it has the basic drawback mentioned above: When large signals are applied to inverting input terminal 1, currents flowing through either transistor 24 and 25 become excessive, limited only by internal effects in the transistors, and damage may occur to either these transistors or the subsequent gain circuits 7 and 8. Additionally, emitter resistors 26 and 27 increase the impedance seen at inverting input terminal 1, contrary to the need for low impedance.

Figure 3:
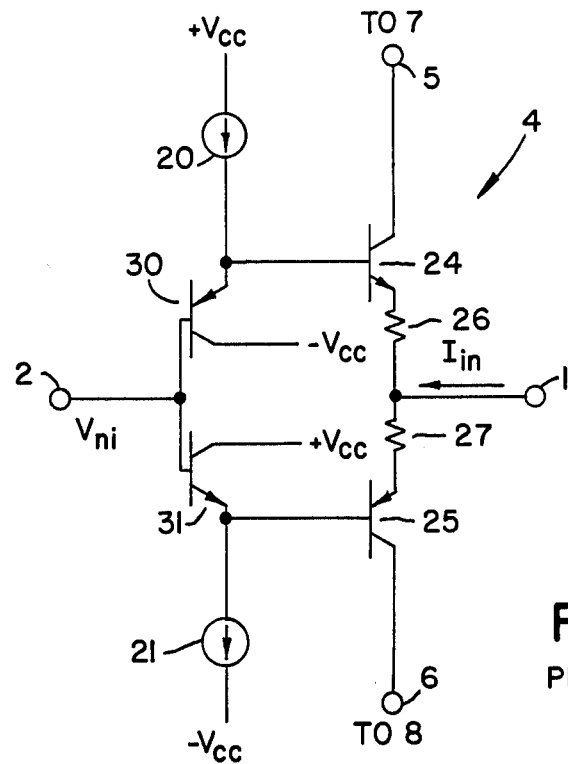

FIG. 3 shows another input buffer circuit known in the art which is quite similar in operation to that of FIG. 2. By comparison to FIG. 2, diode-connected transistors 22 and 23 (FIG. 2) are replaced by active transistors 30 and 31 (FIG. 3), respectively. In FIG. 3 as before, bias currents from sources 20 and 21 flow through emitters of transistors 30 and 31 to generate base voltage bias for transistors 24 and 25, and operation is similar to that of the circuit of FIG. 2. While this circuit has an advantage of providing the additional gain of transistors 30 and 31 to buffer non-inverting input terminal 2 from inverting input terminal 1, it presents an inherent difficulty in reducing offset. For proper matching to reduce offset, transistor 30 must be matched to transistors 24, and transistor 31 to transistor 25. However, transistor 30 is a PNP transistor, while transistor 24 is NPN, and thus the two transistors require dissimilar manufacturing processes which precludes matching in most embodiments. Therefore the circuit of FIG. 3 has inherently poor offset, and includes the problems of excessive currents and potential input impedance increases due to emitter resistors 26 and 27, as discussed in connection with FIG. 2.

Figure 4:
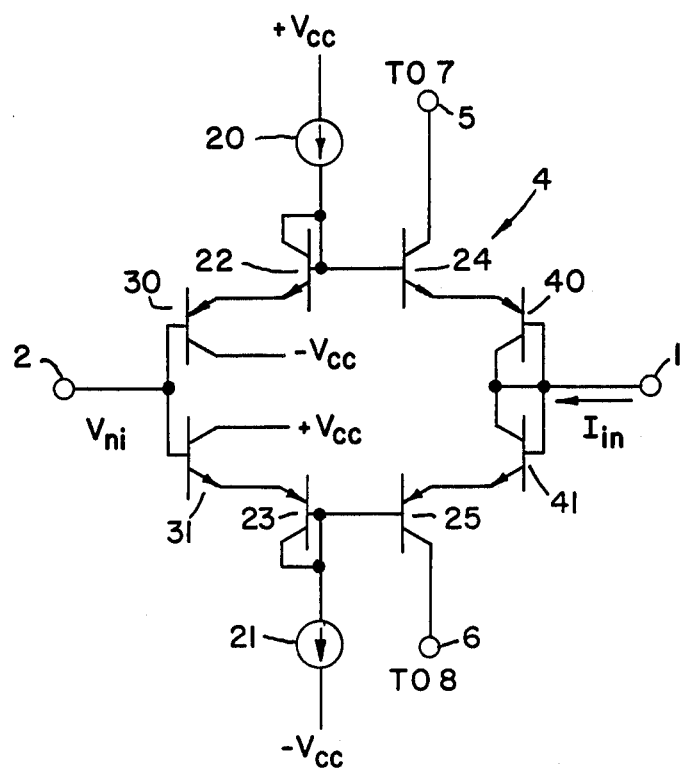

FIG. 4 shows another current feedback input stage known in the art which combines features of both FIG. 2 and FIG. 3. In this circuit, base voltage bias for transistors 24 and 25 is provided by bias currents flowing through diode-connected transistors 22 and 23, as well as active transistors 30 and 31, requiring compensating diode-connected transistors 40 and 41. Now the matching required for offset reduction is between transistors 22 and 24, 30 and 40, 31 and 41, and 23 and 25. Since each of these pairs is either both PNP or both NPN polarities, similar manufacturing, geometries, and construction can be used to achieve matching. However, this circuit requires 8 transistors which may increase cost or consume area in hybrid or integrated circuit embodiments, and suffers from the problem of excessive currents common to the circuits of FIGS. 2 and 3.

Figure 5:
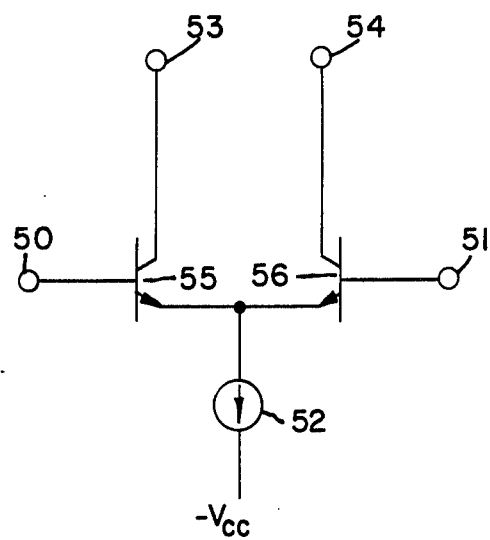

All of the prior art circuits discussed above suffer the problem of potentially excessive current flowing in the input stage or elsewhere in the amplifier. The circuit shown in FIG. 5 is known in the art for providing well limited currents, but it is unsuitable for use in current feedback input buffers. In operation, bias current source 52 provides bias current in common to the emitters of transistors 55 and 56. Terminals 53 and 54 are outputs, while terminals 50 and 51 are inputs. Current limiting in output terminals 53 and 54 is provided by the circuit topology: The maximum current flow through output terminal 53 occurs when transistor 56 conducts no current, in which case the current flowing through transistor 55 to output terminal 53 is limited to that provided by current source 52. The situation is similar for currents through terminal 54.

The circuit of FIG. 5 is unsuitable for use as a current feedback input buffer. Both of input terminals 50 and 51 present a similar high impedance to input signals, as opposed to the requirement for a low impedance input for current feedback. Additionally, the currents flowing through output terminals 53 and 54 are primarily sensitive to the voltage difference between input terminals 50 and 51, as opposed to the requirement for sensitivity to inverting input current in current feedback amplifiers.

It is the purpose of this invention to provide an input buffer for a current feedback amplifier which includes means for limiting sense currents to controlled levels under overdrive conditions.

It is a further purpose of this invention to provide an input buffer for a current feedback amplifier which includes means for limiting currents within the input buffer to controlled levels under overdrive conditions.

It is another purpose of this invention to provide an input buffer for a current feedback amplifier which minimizes offset voltage errors.

It is yet another purpose of this invention to provide an input buffer for a current feedback amplifier which can be constructed with a minimum number of transistors.

SUMMARY OF THE INVENTION AND DESCRIPTION OF THE PREFERRED EMBODIMENT

Figure 6:
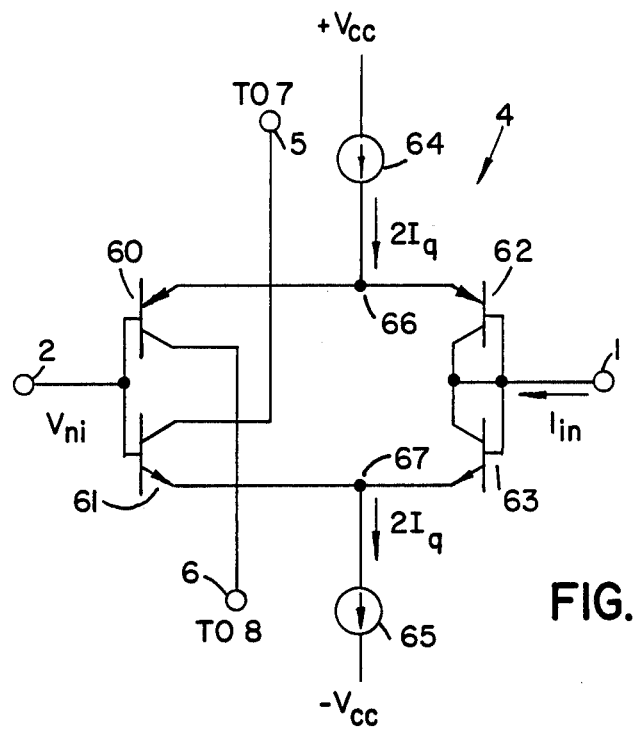
FIGS. 6–8 are schematic diagrams of improved input circuits of the present invention.

The embodiment of the improved amplifier input buffer circuit of the present invention which is to be preferred in many cases is shown in FIG. 6, with inverting input terminal 1, non-inverting input terminal 2, and current sense terminals 5 and 6. In operation, bias current source 64 provides bias current in common to the emitters of transistor 60 and diode-connected transistor 62. Similarly, bias current source 65 provides bias current in common to the emitters of transistor 61 and diode-connected transistor 63. In the preferred embodiment, the currents supplied by bias current sources 64 and 65 are of equal value, 2Iq. The collectors of transistors 61 and 60 form current sense terminals 5 and 6, respectively.

To understand quiescent operating conditions, consider the case where transistors 61 and 63 are ideally matched, and where transistors 60 and 62 are also ideally matched.

Under these conditions, the bias current, 2Iq, provided by source 65 divides equally between transistors 61 and 63, Iq flowing through each. Similarly, the bias current from source 64 flows equally through transistors 60 and 62. With equal currents flowing, the base-emitter voltage drop of transistors 61 and 60 are equal to those of transistors 63 and 62, respectively, because of the matching described above. Thus, it is seen that the open-circuit voltage of inverting input terminal 1 is equal to zero, having no offset for the ideal matching assumed.

The quiescent operating point described above is the only one possible for the circuit of FIG. 6, as can be understood from the following analysis. The currents flowing through diode-connected transistors 62 and 63 must be equal, since no current flows through inverting input terminal 1 under the quiescent conditions. Consider the possibility of an increased current, $Iq+X$, flowing through transistors 62 and 63: This would require diminished current, $Iq-X$, to flow through transistors 60 and 61, owing to the connection of bias current supplies 64 and 65—the additional quiescent current through transistor 62 must be "robbed" from that through transistor 60, and likewise for transistors 63 and 61. However, the diminished current through transistors 60 and 61 reduces the bias voltage difference between common emitter nodes 66 and 67, returning the current flowing through transistors 62 and 63 to its proper quiescent value, Iq.

At the quiescent operating point, the currents flowing into the emitters of transistors 60 and 61 are equal to Iq. Except for the small effects of base currents, then, the quiescent currents flowing through current sense terminals 5 and 6 will also be equal to Iq. In the preferred embodiment, this is the condition required for quiescent operation of gain circuits 7 and 8, and the rest of the amplifier of FIG. 1.

In any physical construction of the circuit of FIG. 6, the ideal matching as assumed above cannot be realized. As will be understood by those skilled in the art of transistor circuit design, deviations from ideal matching will give rise to small offset voltages in the input buffer and mismatching of quiescent currents through terminals 5 and 6. As the analysis above shows, however, minimizing offsets requires only matching of like polarity transistors, and hence the circuit of FIG. 6 is to be preferred over the circuit of FIG. 3 in many instances for minimizing offset voltages.

For proper operation of a current feedback amplifier, the currents flowing through current sense terminals 5 and 6 must be sensitive to the current flowing through inverting input terminal 1. The embodiment of FIG. 6 meets this requirement, as can be seen by considering a signal current, Iin, flowing into inverting input terminal 1. This current divides approximately equally into signal currents of Iin/2 flowing into the collectors of transistors 62 and 63. These ( signal currents flow through common emitter nodes 66 and 67, into the emitters of transistors 60 and 61, respectively, thence (except for small base current effects) out of the respective collectors and through current sense terminals 6 and 5, respectively. Therefore, the embodiment of FIG. 6 provides the sense currents responsive to inverting input current as required.

An additional requirement for a current feedback input buffer is a low impedance to current flowing through inverting input terminal 1. Consider again a signal current, Iin, flowing into terminal 1, which divides into approximately equal portions, Iin/2, one of which flows into the collector of transistor 63: This signal current gives rise to a base-emitter voltage increase at both of transistors 63 and 61 equal to Vin=(-2Re)(Iin/2), where Re is the emitter impedance of a single transistor carrying quiescent current Iq. As will be recognized by one skilled in the art, the input impedance seen at inverting input terminal 1 is expressed as Vin/Iin=Re. This is a low value of impedance (as low as, or comparable to the inverting input impedances of the prior art circuits of FIGS. 2, 3, and 4).

Additionally, the embodiment of FIG. 6 is seen to require only 4 transistors, 60, 61, 62, and 63, and therefore to be preferred, where small areas or parts counts are preferred, over the circuis of FIG. 4, which requires 8 transistors.

While the embodiment of FIG. 6 is to be preferred over some of the prior art circuits for minimizing offsets or transistor count, it is to be preferred over all circuits of the prior art for limiting currents under overdrive conditions. Consider an overdrive signal at inverting input terminal 1 sufficient to elevate the voltage of terminal 1 above that of non-inverting input terminal 2. Since the total current through PNP transistor 62 can flow only from emitter to collector, transistor 62 becomes reverse biased with all of the current from source 64 flowing through transistor 60, thence through current sense terminal 6. Further increases in the voltage at terminal 1 only increase the reverse bias of transistor 62, without increasing current through terminal 6.

Additionally under these overdrive conditions, the base-emitter terminals of transistor 61 become reverse biased and all of the current provided by bias source 65 is diverted through transistor 63. Further increases in overdrive voltage serve only to increase the reverse bias of transistor 61, without increasing current through transistor 63.

Thus current flowing through sense terminal 6 and transistors 63 and 60 are well limited to 2Iq under positive overdrive conditions. A similar analysis under negative overdrive shows that currents through sense terminal 5 and transistors 62 and 61 are also limited to 2Iq. This important distinction makes the present invention to be preferred over all prior art circuits where potential damage due to excessive currents is of concern.

DESCRIPTION OF ALTERNATIVE EMBODIMENTS

As explained above, the quiescent current flowing through current sense terminals 5 and 6 in the embodiment of FIG. 6 is Iq, while the maximum current through these terminals is 2Iq. In many cases, the maximum slew rate of the current feedback amplifier will be determined by the maximum current available at the current sense terminals, so that increasing amplifier slew rate requires increasing input stage bias current. However, this increases quiescent currents through current sense terminals as well, and in some current feedback amplifiers this increases quiescent current throughout the amplifier, causing increased power dissipation and heating.

Figure 7:
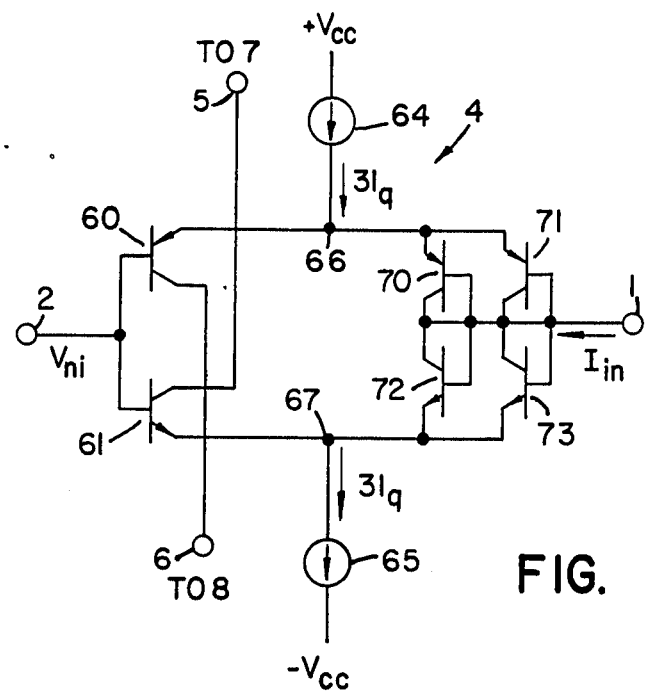

The embodiment of FIG. 7 provides a means of increasing the maximum current available at current sense terminals 5 and 6, without increasing the quiescent current through these terminals.

Comparing FIGS. 6 and 7, it is seen that the diodeconnected transistor 62 of FIG. 6 has been replaced by parallel transistors 70 and 71 in FIG. 7. Similarly, transistor 63 of FIG. 6 has been replaced by transistors 72 and 73 in FIG. 7. Under quiescent operating conditions and assuming ideal matching among transistors 60, 70, and 71, ⅓ of the bias current from source 64 flows through each of transistors 60, 70, and 71. If bias source 64 supplies current 3Iq, then the quiescent current through current sense terminal 6 is Iq, as it is in the embodiment of FIG. 6.

However, under overdrive conditions, all of the current from source 64, or 3Iq, may flow through terminal 6, as opposed to a maximum of only 2Iq in the embodiment of FIG. 6.

Additionally, the parallel combination of transistors 70 and 71, and transistors 72 and 73 lowers the input impedance of inverting input terminal 1, without having increased the quiescent current through terminals 5 and 6.

As will be recognized by one skilled in the pertinent art, the process of connecting transistors in parallel with transistors 70 and 72 and increasing currents from bias sources 64 and 65 may be repeated until limitations of space, transistor count, etc. take effect, with further improvements in maximum slewing current and input impedance.

Figure 8:
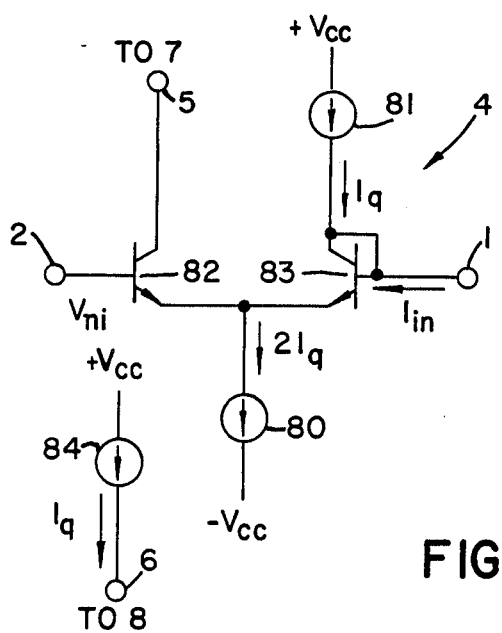

In some cases, particularly where amplifiers are to be built using integrated circuit manufacturing techniques, it may be desirable to construct a current feedback amplifier whose performance parameters rely primarily upon only a single polarity (NPN or PNP) of transistor. An alternative embodiment of the present invention is shown in FIG. 8 which employs only NPN transistors 82 and 83 in the signal path. As will be immediately understood by those familiar with circuit design, the circuit of FIG. 8 also suggests one employing only PNP transistors, formed by replacing NPN transistors with PNP transistors and rever ing the polarity of all voltage and current sources. The following description is intended to apply to either of these embodiments.

The embodiment of FIG. 8 provides an inverting input terminal 1, a non-inverting input terminal 2, and current sense terminal 5. For completeness with FIG. 1, bias current source 84 is shown in FIG. 8 to supply bias current to current sense terminal 6, and thence to gain circuit 8 of FIG. 1. However, current source 84 is not a necessary element of the present invention and in practice might be included as an integral part of gain circuits 7 and 8.

In operation of the embodiment of FIG. 8, current source 80 provides a common bias curent of magnitude 2Iq to the emitters of transistors 82 and 83. With inverting input terminal 1 open-circuited, all of the current from bias current source 81, Iq, flows through transistor 83, so that quiescent current through transistor 82 must also equal Iq. Assuming that transistors 82 and 83 are matched, the offset voltage difference between the open-circuit voltage at terminal 1, and Vni, the input voltage at terminal 2 will be small.

In the presence of a signal current, Iin, flowing through inverting input terminal 1, all of the signal current must flow through transistor 83 and thence through the emitter of transistor 82 because the currents through sources 80 and 81 are fixed. Except for small effects of base currents, all of the signal current flowing through the emitter of transistor 82 flows through the collector of transistor 82 and thence through current sense terminal 5. The impedance encountered by the signal current in traversing the path described above is the sum of the emitter impedances of transistors 82 and 83, which will be low, provided that the quiescent currents are adequate. Thus the embodiment of FIG. 8 provides a low impedance at inverting input terminal 1 and a sense current through terminal 5 which is sensitive to the signal current flowing through terminal 1.

Under overdrive conditions, the operation of the embodiment of FIG. 8 is similar to embodiments previously discussed in that currents are limited both through current sense terminal 5 and through transistors 82 and 83. With positive overdrive voltage at terminal 1, the current through transistor 83 is limited to the value of current supplied by source 80, or 2Iq, and transistor 82 becomes reverse biased, reducing current through terminal 5 to zero. With negative overdrive voltage at terminal 1, transistor 83 becomes reverse biased, and the current through transistor 82 and thence through terminal 5 is limited to the current provided by source 80, again 2Iq in magnitude.

As was discussed in connection with the embodiments of FIG. 7 and FIG. 6, adding additional diode-connected matched transistors in parallel with transistor 83, and increasing the bias current from supplies 80 and 81 will increase maximum sense current available through terminal 5 and reduce the impedance to inverting input currents through terminal 1, without increasing quiescent current through sense terminal 5.

The bias current supplies which are referred to in the description of this invention are conventional and well known. Also, the gain circuits referred to herein are conventional and well known in the art. See, for example, the U.S. Patents and the book by Gray and Meyer cited above.

The embodiments of the present invention have been described above in terms of NPN and PNP bipolar transistors. However, other embodiments based upon other types of transistors, and other slight modifications of the devices taught herein, will be immediately clear to one skilled in the art of circuit design.

One such modification is the substitution of diodes in place of any or all of diode-connected transistors 62, 63, 70, 71, 72, 73 or 83. For proper operation of the present invention, the substituting diode device should be reasonably matched to the transistor it replaces, as has been described above.

A second obvious modification of the embodiments taught herein is the substitution of other transistor devices for the NPN and PNP bipolar transistors shown in FIGS. 6, 7, and 8. These other transistor devices include, but are not limited to, junction field-effect transistors (JFETS), insulated gate field effect transistors (FETS) of either enhancement or depletion mode, MESFETS, vacuum tubes of any number of elements, and devices compounded of simpler transistor devices, such as Darlington transistors, parallel transistors, and cascode-connected transistors.

For the purposes of this invention and the appended claims, reference to "transistor" shall include any electronic device, simple or compound, having at least common, input, and output terminals, and constructed so that a current flowing through said output terminal to said common terminal is responsive to a voltage difference existing at said input terminal with respect to said common terminal. Additionally, reference herein to "emitter," "base," and "collector" terminals of said transistor shall be construed to apply to said common, input and output terminals of said electronic device.

For Example, a reference to "transistor having emitter base and collector terminals" shall be construed as a reference to "bipolar transistor having emitter, base and collector terminals," to "field effect transistor having source, gate, and drain terminals," to "Junction field effect transistor having source, gate, and drain terminals," respectively. A similar construction shall be applied to the other types of transistor devices as described above.

In the language of the claims hereto appended, distinction is made to the polarity of transistor devices as "NPN transistor" or "PNP transistor." Reference to "NPN transistor" shall be constructed to apply to any transistor device as described above wherein the output terminal is biased at a voltage above that of the common terminal under normal operating conditions. Conversely, "PNP transistor" shall be construed to apply to any transistor device wherein the common terminal is biased at a voltage below that of the common terminal under normal operating conditions. For example, "NPN transistor" shall apply as well to a bipolar NPN transistor as to an n-channel field-effect transistor. Similarly, "PNP transistor" shall apply as well to a bipolar PNP transistor as to a p-channel field-effect transistor.

Additionally, as used herein, the term "diode" includes any electronic device having at least common and input terminals, and which is constructed such that the voltage-current characteristic of said common terminal with respect to said input terminal matches the voltage-current characteristic of the common terminal with respect to the input terminal of a transistor. For example, diodes are often constructed of a transistor of the type to be matched by connecting the base and collector together to form one diode terminal, while the emitter formed the other diode terminal.

What is claimed is:

1. A circuit adapted for use as the input buffer for a current feedback amplifier to reduce offset and limit overload currents, said circuit comprising:
   (a) first and second bias current supplies;
   (b) first and second diodes, each having anode and cathode terminals;
   (c) a first PNP transistor having emitter, base and collector terminals;
   (d) a first NPN transistor having emitter, base and collector terminals;
   (e) first and second input terminals;
   (f) first and second current sense terminals through which currents flow which are sensitive to an input current flowing through said first input terminal;
wherein said emitter terminal of said PNP transistor and said anode terminal of said first diode are connected in common to said first bias current supply sucha that a bias current provided by said first bias current supply divides between said PNP transistor and said first diode, and such that a signal current flowing through said first diode flows through said emitter terminal of said PNP transitor; wherein said emitter terminal of said NPN transistor and said cathode terminal of said second diode are connected in common to said second bias current supply such that a bias current provided by said second bias current supply divides between said NPN tyransistor and said second diode, and such that a signal current flowing through said second diode flows through said emitter terminal of said NPN transistor; wherein said base terminals of both said transistors are connected in common to said second input terminal; wherein said cathode terminal of said first diode and said anode terminal of said second diode are connected in common to said first input terminal; wherein said collector terminal of said PNP transistor is connected to said second current sense terminal; and wherein said collector terminal of said NPN transistor is connected to said first current sense terminal.

2. A circuit in accordance with claim 1, wherein said first diode comprises a second PNP transistor having emitter, base and collector terminals; wherein said emitter terminal of said second PNP transistor comprises said anode of said first diode; and wherein said base and collector terminals of said second PNP transistor are connected together and comprise said cathode of said first diode.

3. A circuit in accordance with claim 1, wherein said second diode comprises a second NPN transistor having emitter, base and collector terminals; wherein said emitter of said second NPN transistor comprises said cathode of said second diode; and wherein said base and collector terminals of said second NPN transistor are connected together and comprise said anode of said second diode.

4. A circuit in accordance with claim 3, wherein said first diode comprises a second PNP transistor having emitter, base and collector terminals; wherein said emitter terminal of said second PNP transistor comprises said anode of said first diode; and wherein said base and collector terminals of said second PNP transistor are connected together and comprise said cathode of said first diode.

5. A circuit in accordance with claim 1, wherein said first diode comprises a plurality of PNP transistors each having emitter, base and collector terminals; wherein said emitter terminals of said plurality of PNP transistors are connected together and comprise said anode of said first diode; and wherein said base and collector terminals of said plurality of PNP transistors are connected together and comprise said cathode of said first diode.

6. A circuit in accordance with claim 1, wherein said second diode comprises a plurality of NPN transistors each having emitter, base and collector terminals; wherein said emitter terminals of said plurality of NPN transistors are connected together and comprise said cathode of said second diode; and wherein said base and collector terminals of said plurality of NPN transistors are connected together and comprise said anode of said second diode.

7. A circuit in accordance with claim 6, wherein said first diode comprises a plurality of PNP transistors each having emitter, base and collector terminals; wherein said emitter terminals of said plurality of PNP transistors are connected together and comprise said anode of said first diode; and wherin said base and collector terminals of said plurality of PNP transistors are connected together and comprise said cathode of said first diode.

8. A current feedback amplifier having first and second input terminals and an output terminal, said amplifier comprising:
   (a) a gain circuit having input and output terminals;
   (b) an output buffer having input and output terminals; and
   (c) an input buffer having first and second input terminals and a current sense terminal; wherein said first and second input terminals of said input buffer comprise said input terminals of said amplifier; wherein said current sense terminal is connected to said input terminal of said gain circuit;
wherein said output terminal of said gain circuit is connected to said input terminal of said output buffer; wherein said output terminal of said output buffer comprises said output terminal of said amplifier; wherein said input buffer comprises:
   (i) a first NPN transistor having base, emitter and collector terminals;
   (ii) a diode having anode and cathode terminals;
   (iii) first and second bias current supplies;
wherein said base terminal comprises said second input terminal of said input buffer; wherein said emitter terminal is connected in common with said cathode terminal of said diode to said second bias current supply; wherein said collector terminal comprises said current sense terminal; and wherein said anode of said diode is connected in common with said first bias current supply to said first input terminal of said input buffer.

9. A current feedback amplifier in accordance with claim 8, wherein said diode comprises a second NPN transistor having emitter, base and collector terminals, wherein said emitter terminal of said second NPN transistor comprises said cathode of said diode; and wherein said base and collector terminals of said second NPN transistor are connected together and comprise said anode of said diode.

10. A current feedback amplifier having first and second input terminals and an output terminal, said amplifier comprising:
(a) a gain circuit having input and output terminals;
(b) an output buffer having input and output terminals; and
(c) an input buffer having first and second input terminals and a current sense terminal; wherein said first and second input terminals of said input buffer comprise said input terminals of said amplifier; wherein said current sense terminal is connected to said input terminal of said gain circuit;
wherein said output terminal of said gain circuit is connected to said input terminal of said output buffer; wherein said output terminal of said output buffer comprises said output terminal of said amplifier; wherein said input buffer comprises:
(i) a first PNP transistor having base, emitter and collector terminals;
(ii) a diode having cathode and anode terminals;
(iii) first and second bias current supplies; wherein said base terminal comprises said second input terminal of said input buffer; wherein said emitter terminal is connected in common with said anode terminal of said diode to said second bias current supply; wherein said collector terminal comprises said current sense terminal; and wherein said cathode of said diode is connected in common with said first bias current supply to said first input terminal of said input buffer.

11. A current feedback amplifier in accordance with claim 10, wherein said diode comprises a second PNP transistor having emitter, base and collector terminals, wherein said emitter terminal of said second PNP transistor comprises said anode of said diode; and wherein said base and collector terminals of said second PNP transistor are connected together and comprise said cathode of said diode.

12. A current feedback amplifier having first and second input terminals and an output terminal, said amplifier comprising:
(a) first and second gain circuits each having input and output terminals;
(b) an output buffer having input and output terminals; and
(c) an input buffer having first and second input terminals and first and second current sense terminals; wherein said first and second input terminals of said input buffer comprise said input terminals of said amplifier;
wherein said first current sense terminal is connected to said input terminal of said first gain circuit; wherein said second current sense terminal is connected to said input terminal of said second gain circuit; wherein said output terminals of said first and second gain circuit are connected in common to said input terminal of said output buffer; wherein said output terminal of said output buffer comprises said output terminal of said amplifier; wherein said input buffer comprises:
(i) first and second bias current supplies;
(ii) first and second diodes, each having anode and cathode terminals;
(iii) a first PNP transistor having emitter, base and collector terminals;
(iv) a first NPN transistor having emitter, base and collector terminals;
(v) first and second input terminals;
wherein said emitter terminal of said PNP transistor and said anode terminal of said first diode are connected in common to said first bias current supply; wherein said emitter terminal of said NPN transistor and said cathode terminal of said second diode are connected in common to said second bias current supply; wherein said base terminals of both said transistors are connected in common to said second input terminal of said input buffer; wherein said cathode terminal of said first diode and said anode terminal of said second diode are connected in common to said first input terminal of said input buffer; wherein said collector terminal of said PNP transistor is connected to said second current sense terminal; and wherein said collector terminal of said NPN transistor is connected to said first current sense terminal.

13. A current feedback amplifier in accordance with claim 12, wherein said first diode comprises a second PNP transistor having emitter, base and collector terminals; wherein said emitter terminal of said second PNP transistor comprises said anode of said first diode; and wherein said base and collector terminals of said second PNP transistor are connected together and comprise said cathode of said first diode 14. A current feedback amplifier in accordance with claim 12, wherein said second diode comprises a second NPN transistor having emitter, base and collector terminals; wherein said emitter of said second NPN transistor comprises said cathode of said second diode; and wherein said base and collector terminals of said second NPN transistor are connected together and comprise said anode of said second diode.

15. A current feedback amplifier in accordance with claim 14, wherein said first diode comprises a second PNP transistor having emitter, base and collector terminals; wherein said emitter terminal of said second PNP transistor comprises said anode of said first diode; and wherein said base and collector terminals of said second PNP transistor are connected together and comprise said cathode of said first diode.

16. A current feedback amplifier in accordance with claim 12, wherein said first diode comprises a plurality of PNP transistors each having emitter, base and collector terminals; wherein said emitter terminals of said plurality of PNP transistors are connected together and comprise said anode of said first diode; and wherein said base and collector terminals of said plurality of PNP transistors are connected together and comprise said cathode of said first diode.

17. A current feedback amplifier in accordance with claim 12, wherein said second diode comprises a plurality of NPN transistors each having emitter, base and collector terminals; wherein said emitter terminals of said plurality of NPN transistors are connected together and comprise said cathode of said second diode; and wherein said base and collector terminals of sai plurality of NPN transistors are connected together and comprise said anode of said second diode.

18. A current feedback amplifier in accordance with claim 17, wherein said first diode comprises a plurality of PNP transistors each having emitter, base and collector terminals; wherein said emitter terminals of said plurality of PNP transistors are connected together and comprise said anode of said first diode; and wherein said base and collector terminals of said plurality of PNP transistors are connected together and comprise said cathode of said first diode.

* * * * *